(12) United States Patent  
Ishikawa

(10) Patent No.: US 6,970,028 B2  
(45) Date of Patent: Nov. 29, 2005

(54) DLL CIRCUIT

(75) Inventor: Toru Ishikawa, Tokyo (JP)

(73) Assignee: Elpida Memory, Inc., Tokyo (JP)

(*) Notice: Subject to any disclaimer, the term of this patent is extended or adjusted under 35 U.S.C. 154(b) by 12 days.

(21) Appl. No.: 10/785,015

(22) Filed: Feb. 25, 2004

(65) Prior Publication Data

US 2004/0169538 A1 Sep. 2, 2004

(30) Foreign Application Priority Data

Feb. 27, 2003 (JP) ........................................ 2003-050587

(51) Int. Cl.[7] .............................................. H03L 7/06
(52) U.S. Cl. ..................................... 327/158; 327/149
(58) Field of Search ................................ 327/149, 153, 327/158, 161, 163, 276, 277, 284, 291

(56) References Cited

U.S. PATENT DOCUMENTS 6,100,735 A * 8/2000 Lu .............................. 327/158  
6,535,043 B2 * 3/2003 Chen ........................... 327/291

OTHER PUBLICATIONS

Tatsuya Matano, et al., "A 1–Gb/pin 512–Mb DDRII SDRAM using a digital DLL and a slew–rate–controlled output buffer", 2002 VLSI Symposium: Thesis No. 9–1.

* cited by examiner

Primary Examiner—Linh My Nguyen  
(74) Attorney, Agent, or Firm—McGinn & Gibbs, PLLC

(57) ABSTRACT

DLL circuit with a small minimum delay time while allowing a wide range of adjustment of the delay time. The DLL circuit according includes a first delay circuit for delaying an input clock signal (CLK1) to output a plurality of delayed clock signals ($T_1$ to $T_N$), a first selector (7) for selecting a first delayed clock signal (CLK_E) and a second delayed clock signal (CLK_O) from among the plurality of delayed clock signals ($T_1$ to $T_N$), for output, a second delay circuit (3) for delaying the input clock signal (CLK1) to generate a slightly delayed clock signal (CLKD), a second selector (4) for selecting two selected clock signals (FDLE, FDLO) from among the slightly delayed clock signal (CLKD), first delayed clock signal (CLK_E), and second delayed clock signal (CLK_O), and a delay synthesis circuit (5) for generating an internal clock signal ($CLK_{IN}$) from the selected clock signals (FDLE, FDLO), for output.

12 Claims, 9 Drawing Sheets

DLL CIRCUIT

FIELD OF THE INVENTION

The present invention relates to a DLL (Delay Locked Loop) circuit. More specifically, the invention relates to the DLL circuit used for delaying a clock signal by a desired delay time to generate an internal clock signal used in the inside of a semiconductor device.

BACKGROUND OF THE INVENTION

Semiconductor devices sometimes have a DLL circuit for delaying an external clock signal supplied from the outside of the semiconductor devices by a desired delay time to generate an internal clock signal. In a synchronous memory, for example, in order to output data in synchronization with an external clock signal, the internal clock signal is generated from the external clock signal, and the timing of outputting the data is synchronized with the internal clock signal. In view of the delay time of a circuit for outputting the data, the internal clock signal is generated to have a phase so that the timing of outputting the data from the synchronous memory matches the rise (or fall) timing of the external clock signal.

Nonpatent Document 1 discloses a typical DLL circuit. FIG. 8 is a schematic diagram of a DLL circuit that is known. The known DLL circuit includes an input buffer 101, a delay selection circuit 102, and a delay synthesis circuit 103. The delay selection circuit 102 includes delay elements $104_1$ to $104_N$ connected in series, where N is a natural number equal to or more than two, and a selector 105.

An external clock signal $CLK_{EX}$ supplied from an outside of the DLL circuit is input to the input terminal of the input buffer 101. The input buffer 101 reproduces the waveform of the external clock signal $CLK_{EX}$ to generate a clock signal CLK1.

The clock signal CLK1 is input to the input terminal of the delay element $104_1$ in the first stage of the delay selection circuit 102. The delay elements $104_1$ to $104_N$ connected in series delay clock signals input to the delay elements $104_1$ to $140_N$, respectively, and outputs clock signals $T_1$ to $T_N$ from their output terminals, respectively. The delay time of the clock signal $T_p$ with respect to the internal clock signal CLK1, where p is a natural number equal to or less than N, is larger as p increases.

The selector 105 selects two-clock signals FDLO and FDLE output from two adjacent delay elements from among the clock signals $T_1$ to $T_N$ output from the output terminals of the delay elements $104_1$ to $104_N$, respectively. Of the clock signals FDLO and FDLE, the clock signal FDLE corresponds to the clock signal output from the delay element $104_{2q}$ in an even-numbered stage, while the clock signal FDLO corresponds to the clock signal output from the delay element $104_{2q+1}$ in an odd-numbered stage, where q is a natural number selected so that 2q+1 does not exceed N. The delay synthesis circuit 103 synthesizes the clock signals FDLO and FDLE to generate an internal clock signal $CLK_{IN}$. The delay synthesis circuit 102 further has a function of finely adjusting its delay time.

The delay time of the known DLL circuit is coarsely adjusted to be close to a desired value by adequately selecting two of the clock signals $T_1$ to $T_N$ to generate the clock signals FDLO and FDLE. Further, the delay time of the DLL circuit is accurately adjusted to the desired value by the operation of the delay synthesis circuit 103.

One problem with the known DLL circuit is that the minimum delay time that can be achieved by the DLL circuit (which will be hereinafter simply referred to as the "minimum delay time") increases when the number of the delay elements $104_1$ to $104_N$ is increased so as to allow a wide range of adjustment of the delay time. As the number of the delay elements $104_1$ to $104_N$ is increased, the number of input terminals of the selector 105 also increases. As is well known by a person skilled in the art, as the number of the input terminals of the selector 105 increases, the delay time of the selector 105 increases with it. An increase in the delay time of the selector 105 would increase the minimum delay time of the DLL circuit. A large minimum delay time of the DLL circuit is not desirable since it hinders a faster operation of the semiconductor device into which the DLL circuit is integrated.

It is desirable for the DLL circuit to have a small minimum delay time. It is more preferable that the DLL circuit has the small minimum delay time while allowing the wide range of adjustment of the delay time.

[Nonpatent Document 1]

Tatsuya Matano et al., "A 1 Gb/s/pin 512 Mb DDR2 SDRAM using a digital DLL and a slew-rate-controlled output buffer", 2002 VLSI Symposium: thesis number 9-1

SUMMARY OF THE DISCLOSURE

An object of the present invention is to provide a DLL circuit with a small minimum delay time. Other object of the present invention is to provide a DLL circuit with a small minimum delay time while allowing a wide range adjustment of the delay time.

Hereinafter, means for solving the problems will be described using numerals and characters that will be employed in [embodiments]. These numbers and characters are added to clarify the correspondence relationship between description of [claims] and description of the [embodiments]. The added numbers and characters must not be used for interpretation of technical scopes of inventions set forth in the [claims].

A DLL circuit according to the present invention includes:

a first delay circuit for delaying an input clock signal (CLK1) to output a plurality of delayed clock signals ($T_1$ to $T_N$);

a first selector (7) for selecting a first delayed clock signal (CLK_E) and a second delayed clock signal (CLK_O) from among the plurality of delayed clock signals ($T_1$ to $T_N$);

a second delay circuit (3) for delaying the input clock signal (CLK1) to generate a slightly delayed clock signal (CLKD);

a second selector (4) for selecting two selected clock signals (FDLE, FDLO) from among the slightly delayed clock signal (CLKD), first delayed clock signal (CLK_E), and second delayed clock signal (CLK_O), for output; and a delay synthesis circuit (5) for generating an internal clock signal ($CLK_{IN}$) from the selected clock signals (FDLE, FDLO), for output. Since the slightly delayed clock signal (CLKD) described above is generated without invention of the first selector (7), it is possible to reduce a delay time from the input clock signal (CLK1). The DLL circuit can generate the internal clock signal ($CLK_{IN}$) using this slightly delayed clock signal (CLKD). Thus, its minimum delay time can be reduced.

This configuration is effective in a case where the delay time during which the slightly delayed clock signal (CLKD) is generated from the input clock signal (CLK1) is shorter than sum of a delay time during which the first delayed clock signal (CLK_E or CLK_O) is generated from the input clock signal (CLK1) and a delay time of the first selector (7).

More specifically, the configuration described above is effective in the case where, if the slightly delayed clock signal (CLKD) is set to include M slightly delayed clock signals, in which M is an integer of at least one, M+2 is smaller than the number N of the plurality of delayed clock signals ($T_1$ to $T_N$). The DLL circuit described above can extend a range that can be assumed by the slew rate, by increasing the number of the delayed clock signals ($T_1$ to $T_N$). On the other hand, when the number of the delayed clock signals ($T_1$ to $T_N$) is increased, the delay time of the first selector (7) increases. Then, if the first selector (7) is used, the minimum delay time cannot be reduced. The configuration described above can generate the internal clock signal ($CLK_{IN}$) by using the slightly delayed clock signal (CLKD) generated without the medium of the first selector (7), so that it can reduce the minimum delay time.

The first delay circuit ($6_1$ to $6_N$) can include first to Nth delay elements connected in series. In this case, the input clock signal (CLK1) is supplied to the input terminal of the first delay element ($6_1$), and the output terminal of the ith delay element ($6_i$), where i is an arbitrary natural number not more than N−1, is connected to the input terminal of the (i+1)th delay element ($6_{i+1}$). The first selector (7) selects the clock signals ($T_m$, $T_{m+1}$) output from the output terminal of the mth delay element ($6_m$), in which m is a number selected from among natural numbers of at least one and not more than N−1, and the output terminal of the (m+1)th delay element ($6_{m+1}$), respectively, as the first delayed clock signal (CLK_E) and the second delayed clock signal (CLK_O).

In this case, it is ideal that the delay time during which the slightly delayed clock signal (CLKD) is generated from the input clock signal (CLK1) be shorter than the sum of the delay time of the first delay element ($6_1$) and the delay time of the first selector (7).

The number of slightly delayed clock signals (CLKD) is not limited to one. The number of the slightly delayed clock signals (CLKD) can be M, in which M is an integer of at least one.

When the second delay circuit (3) includes first to mth delay devices ($3_1$ to $3_M$; M=2) that generate the slightly delayed clock signals (CLKD) from the input clock signal (CLK1), respectively, it is ideal that the delay times of the second to Nth delay elements ($6_2$ to $6_N$) included in the first delay circuit ($6_1$ to $6_N$) be identical, and using a delay time Td2 of the first delay element ($6_1$), a delay time Td3 of the first selector (7), and delay times Td5 of the second to Nth delay elements ($6_2$ to $6_N$), a delay time $td_j$ of the jth delay device among the first to Mth delay devices ($3_1$, $3_2$) in the second delay circuit (3), where j is an arbitrary natural number equal to or less than M, be expressed by:

$$td_j = Td2 + Td3 - j \cdot Td5.$$

This makes a difference between the delay times of the selected clock signals (FDLE, FDLO) always fixed at Td5, which is desirable in terms of simplification of the design of the delay synthesis circuit.

A DLL circuit according to the present invention includes:

an input buffer (1) for receiving an external clock signal ($CLK_{EX}$) and then generating an input clock signal (CLK1);

a first delay circuit ($6_1$ to $6_N$) for delaying the input clock signal (CLK1) to output a plurality of delayed clock signals ($T_1$ to $T_N$);

a first selector (7) for selecting a first delayed clock signal (CLK_E) and a second delayed clock signal (CLK_O) from among the plurality of delayed clock signals ($T_1$ to $T_N$);

a second delay circuit (3) for delaying the input clock signal (CLK1) to generate a first slightly delayed clock signal (CLKD);

a third delay circuit (3') for delaying the external clock signal ($CLK_{EX}$) to generate a second slightly delayed clock signal (CLKD');

a second selector (4) for selecting two selected clock signals (FDLE, FDLO) from among the first slightly delayed clock signal (CLKD), the second slightly delayed clock signal (CLKD'), the first delayed clock signal (CLK_E), and the second delayed clock signal (CLK_O); and a delay synthesis circuit (5) for synthesizing an internal clock signal ($CLK_{IN}$) from the selected clock signals (FDLE, FDLO). When the input buffer (1) that receives the external clock signal ($CLK_{EX}$) and reproduces its waveform in order to generate the input clock signal (CLK1) is employed, the DLL circuit can further reduce the minimum delay time.

When this configuration is adopted, it is preferable that the delay time during which the first slightly delayed clock signal (CLKD) is generated from the input clock signal (CLK1) is shorter than the sum of the delay time in which the first delayed clock signal (CLK_E or CLK_O) is generated from the input clock signal (CLK1) and the delay time of the first selector (7). It is preferable that the delay time during which the second slightly delayed clock signal (CLKD') is generated from the external clock signal ($CLK_{EX}$) is shorter than the sum of the delay time of the input buffer (1) and the delay time during which the first slightly delayed clock signal (CLKD) is generated from the input clock signal (CLK1).

The first delay circuit ($6_1$ to $6_N$) can be configured by including first to nth delay elements ($6_1$ to $6_N$) connected in series. The input clock signal (CLK1) is supplied to the input terminal of the first delay element ($6_1$). The output terminal of the ith delay element ($6_i$), where i is an arbitrary natural number not more than N−1, is connected to the input terminal of the (i+1)th delay element ($6_{i+1}$). The first selector (7) selects the clock signals ($T_m$, $T_{m+1}$) output from the output terminal of the mth delay element ($6_m$), where m is a number selected from among natural numbers of at least one and not more than N−1, and the output terminal of the (m+1)th delay element ($6_{m+1}$), respectively, for output, as the first delayed clock signal (CLK_E) and the second delayed clock signal (CLK_O).

The number of first slightly delayed clock signals (CLKD) and the number of second slightly delayed clock signals (CLKD') are not limited to one. When the number of the first slightly delayed clock signals (CLKD) is set to M, where M is an integer of at least one, and when the number of the second slightly delayed clock signals (CLKD') is set to M', where M' is an integer of at least one, it is ideal that the delay times of the second to Nth delay elements ($6_2$ to $6_N$) be identical. The second delay circuit (3) may include first to Mth delay devices ($3_1$ to $3_M$; M=2) for respectively generating the first slightly delayed clock signals (CLKD). The third delay circuit (3') may include first to M'th slight delay devices ($3_1'$ to $3_{M'}$; M'=2) for respectively generating the second slightly delayed clock signals (CLKD). It is ideal that a delay time $td_j$ of the jth delay device ($3_j$) among the first to the Mth delay devices ($3_1$ to $3_M$), where j is a natural number equal to or less than M, and a delay time $td_k$ of the kth slight delay device ($3_k'$) among the first to M'th slight delay devices, where k is a natural number equal to or less than M' be expressed by following formulas, using a delay time Td1 of the input buffer (1), a delay time Td2 of the first delay element ($6_1$), a delay time Td3 of the first selector (7), and delay times Td5 of the second to Nth delay elements ($6_2$ to $6_N$):

$$td_j = Td2 + Td3 - j \cdot Td5,$$

$$td_k = Td1 + Td2 + Td3 - (M+k) \cdot Td5.$$

This makes a difference between the delay times of the selected clock signals (FDLE, FDLO) always fixed at Td5, which is desirable, in terms of simplification of the design of the delay synthesis circuit.

In the DLL circuit, it is ideal that the delay synthesis circuit (5) generate the internal clock signal ($CLK_{IN}$) from the selected clock signals (FDLE, FDLO) for output so that a rise timing of the internal clock signal ($CLK_{IN}$) is between rise timings of the selected clock signals (FDLE, FDLO), and a fall timing of the internal clock signal ($CLK_{IN}$) is between fall timings of the selected clock signals (FDLE, FDLO).

PREFERRED EMBODIMENTS OF THE INVENTION

Figure 1:
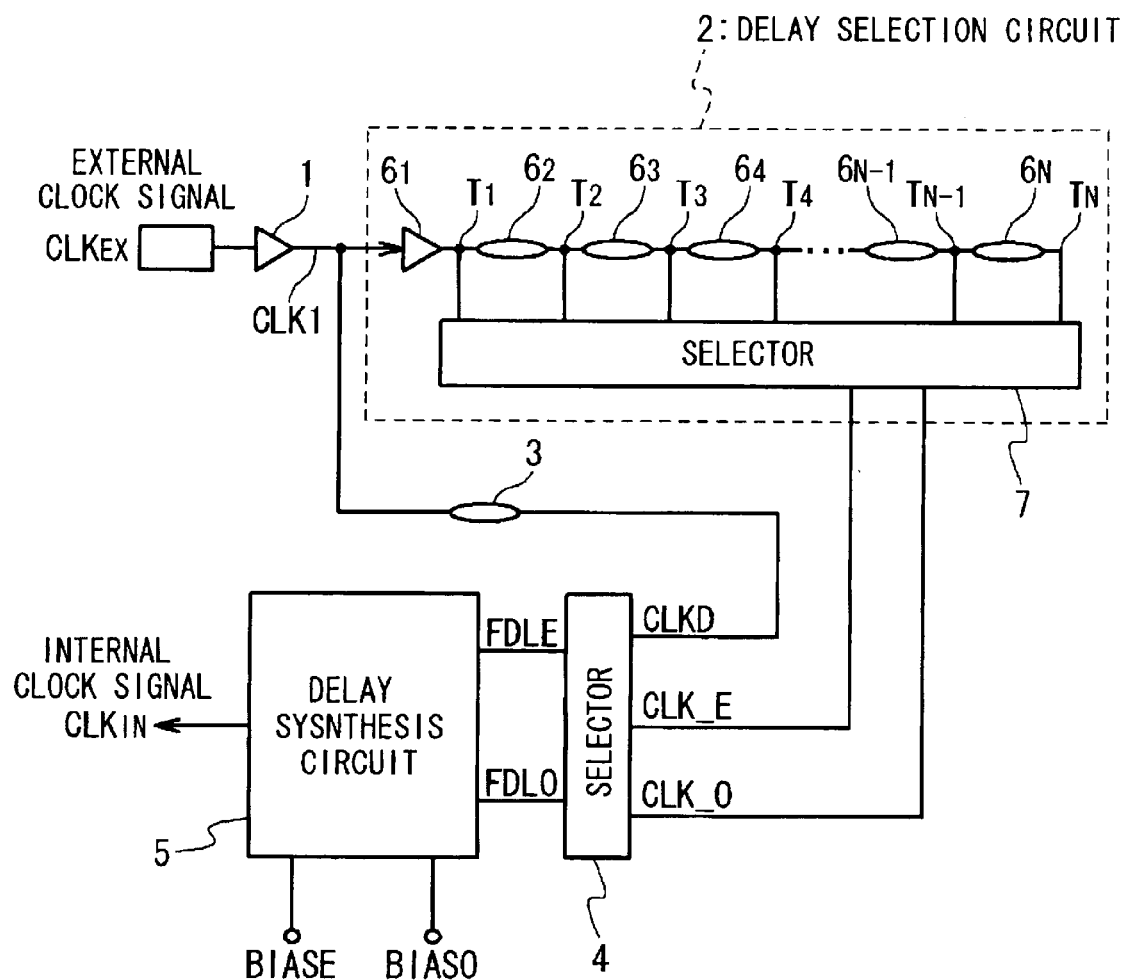
FIG. 1 shows a DLL circuit in an embodiment of the present invention.

As is shown in FIG. 1, an embodiment of the present invention is a DLL circuit that delays an external clock signal $CLK_{EX}$ supplied from its outside by a desired delay time to generate an internal clock signal $CLK_{IN}$. The DLL circuit includes an input buffer 1, a delay selection circuit 2, a delay device 3, a selector 4, and a delay synthesis circuit 5.

The input buffer 1 reproduces the waveform of the external clock signal $CLK_{EX}$ supplied to its input terminal to generate a clock signal CLK1. The input buffer 1 outputs the clock signal CLK1 to the delay selection circuit 2. The clock signal CLK1 is input to the delay selection circuit 2.

The delay selection circuit 2 delays the clock signal CLK1 to generate two clock signals CLK_E and CLK_O. The delay time of the delay selection circuit 2 (i.e. the delay time during which the clock signal CLK_E is generated from the clock signal CLK1 and the delay time during which the clock signal CLK_O is generated from the clock signal CLK1) is adjustable. The delay selection circuit 2 plays a role in coarsely adjusting the delay time of the DLL circuit.

The delay selection circuit 2 includes a plurality of delay elements $6_1$ to $6_N$ connected in series and a selector 7. The delay elements $6_1$ to $6_N$ are delay circuits used for generating a plurality of clock signals $T_1$ to $T_N$ having mutually different phases from the clock signal CLK1. The clock signal CLK1 supplied to the delay selection circuit 2 is input to the input terminal of the delay element $6_1$ in the first stage.

The output terminal of the delay element $6_1$ is coupled to the input terminal of the delay element $6_2$ in the second stage, and the delay element $6_2$ delays the clock signal $T_1$ generated by the delay element $6_1$ to output the clock signal $T_2$. Likewise, the output terminal of the delay element $6_i$ in an ith stage is connected to the delay element $6_{i+1}$ in an (i+1)th stage, and the delay element $6_{i+1}$ in the (i+1)th stage delays the clock signal $T_i$ output from the delay element $6_i$ in the ith stage to output the clock signal $T_{i+1}$, where i is an integer of at least one and not more than N−1. In order to reproduce the waveform of the signal input to the delay selection circuit 2 for output, a buffer is employed as the delay element $6_1$ in the first stage. For this reason, hereinafter, the delay element $6_1$ will be sometimes described as a buffer $6_1$. The clock signals $T_1$ to $T_N$ that the delay elements $6_1$ to $6_N$ output, respectively, are input to the selector 7.

The selector 7 selects the clock signals $T_m$ and $T_{m+1}$ generated by the two adjacent delay elements $6_m$ and $6_{m+1}$, where m is a natural number not more than N−1, from among the clock signals $T_1$ to $T_N$ respectively output from the delay elements $6_1$ to $6_N$, and outputs them as the clock signals CLK_E and CLK_O. One of the delay elements $6_m$ and $6_{m+1}$ is the delay element in an even-numbered stage, while the other is the delay element in an odd-numbered stage. Of the clock signals $T_m$ and $T_{m+1}$, the clock signal CLK_E is the clock signal generated by the delay element in the even-numbered stage, while the clock signal CLK_O is the clock signal generated by the delay element in the odd-numbered stage. When the clock signals $T_1$ and $T_2$ are selected by the selector 7, for example, the clock signal $T_1$ is output as the clock signal CLK_O, and the clock signal $T_2$ is output as the clock signal CLK_E. On the other hand, when the clock signals $T_2$ and $T_3$ are selected by the selector 7, the clock signal $T_2$ is output as the clock signal CLK_E, and the clock signal $T_3$ is output as the clock signal CLK_O. Which ones of the clock signals $T_1$ to $T_N$ are selected as the clock signals CLK_E and CLK_O is controlled by a controller not shown.

The number N of the delay elements $6_1$ to $6_N$ included in the delay selection circuit 2 determines the extent of an adjustable range of the delay time of the DLL circuit. In order to extend the adjustable range of the delay time of the DLL circuit, a lot of the delay elements $6_1$ to $6_N$ are used. Typically, the number N of the delay elements $6_1$ to $6_N$ is 128. Since the number N of the delay elements $6_1$ to $6_N$ is large, the delay time of the selector 7 is comparatively large.

The clock signal CLK1 output from the input buffer 1 described above is also input to the input terminal of the delay device 3. The delay device 3 delays the clock signal CLK1 to generate a clock signal CLKD.

A delay time td of the delay device 3 is shorter than the sum of a delay time Td2 of the delay element $6_1$ in the first stage of the delay selection circuit 2 and a delay time Td3 of the selector 7. The sum of the delay time Td2 of the delay element $6_1$ and the delay time Td3 of the selector 7 is the minimum delay time that can be assumed by the delay selection circuit 2. Thus, the delay time td of the delay device 3 is shorter than the minimum delay time of the delay selection circuit 2.

Since the clock signal CLKD is generated without the medium of the selector 7 having a large delay time, the delay time from the external clock signal $CLK_{EX}$ to the clock signal CLKD can be reduced.

The clock signals CLK_E and CLK_O output from the selector 7 in the delay selection circuit 2 and the clock signal CLKD output from the delay device 3 are input to the respective three input terminals of the selector 4. The selector 4 has two output terminals and selectively outputs two of the clock signals CLKD, CLK_E, and CLK_O. One of the clock signals CLKD and CLK_E is output as a clock signal FDLE, and the clock signal CLK_O is selected as a clock signal FDLO and output. The number of the input terminals of the selector 4 is three, which is small. Thus, the delay time of the selector 4 is extremely short as compared with the delay time of the selector 7 of the delay selection circuit 2, and is a practically ignorable level.

The delay synthesis circuit 5 is an analog circuit for synthesizing the clock signals FDLO and FDLE output from the selector 4 to generate the internal clock signal $CLK_{IN}$. More specifically, the delay synthesis circuit 5 generates the internal clock signal $CLK_{IN}$ for output so that a rise timing of the internal clock signal $CLK_{IN}$ is between rise timings of the clock signal FDLO and the clock signal FDLE and a fall timing of the internal clock signal $CLK_{IN}$ is between fall timings of the clock signal FDLO and the clock signal FDLE.

The internal clock signal $CLK_{IN}$ is generated in response to bias voltages BIASE and BIASO indicating a synthesis ratio R of the clock signal FDLE to the clock signal FDLO, where $0 \leq R \leq 1$. The synthesis ratio R is a parameter that determines the delay time of the internal clock signal $CLK_{IN}$ from the external clock signal $CLK_{EX}$ (or the delay time of the DLL circuit). When the delay times of the clock signals FDLO and FDLE from the external clock signal $CLK_{EX}$ are indicated by Ta and Tb, respectively, the internal clock signal $CLK_{IN}$ is generated so that a delay time $T_{DLL}$ of the internal clock signal $CLK_{IN}$ from the external clock signal $CLK_{EX}$ is expressed by the following equation:

$$T_{DLL} = Ta + (Tb - Ta) * R \quad (1)$$

The synthesis ratio R sometimes represents that the clock signal FDLE is synthesized at a rate of 100×R (%), and the clock signal FDLO is synthesized at a rate of to 100×(1−R)%. The synthesis ratio R of one, for example, can represent that the clock signal FDLE is synthesized at the rate of 100 (%), and the clock signal FDLO is synthesized at the rate of 0 (%).

The bias potentials BIASO and BIASE are supplied to the delay synthesis circuit 5 after being determined to indicate the desired synthesis ratio R by the controller. The delay synthesis circuit 5 functions to finely adjust the delay time of the DLL circuit.

Figure 2:
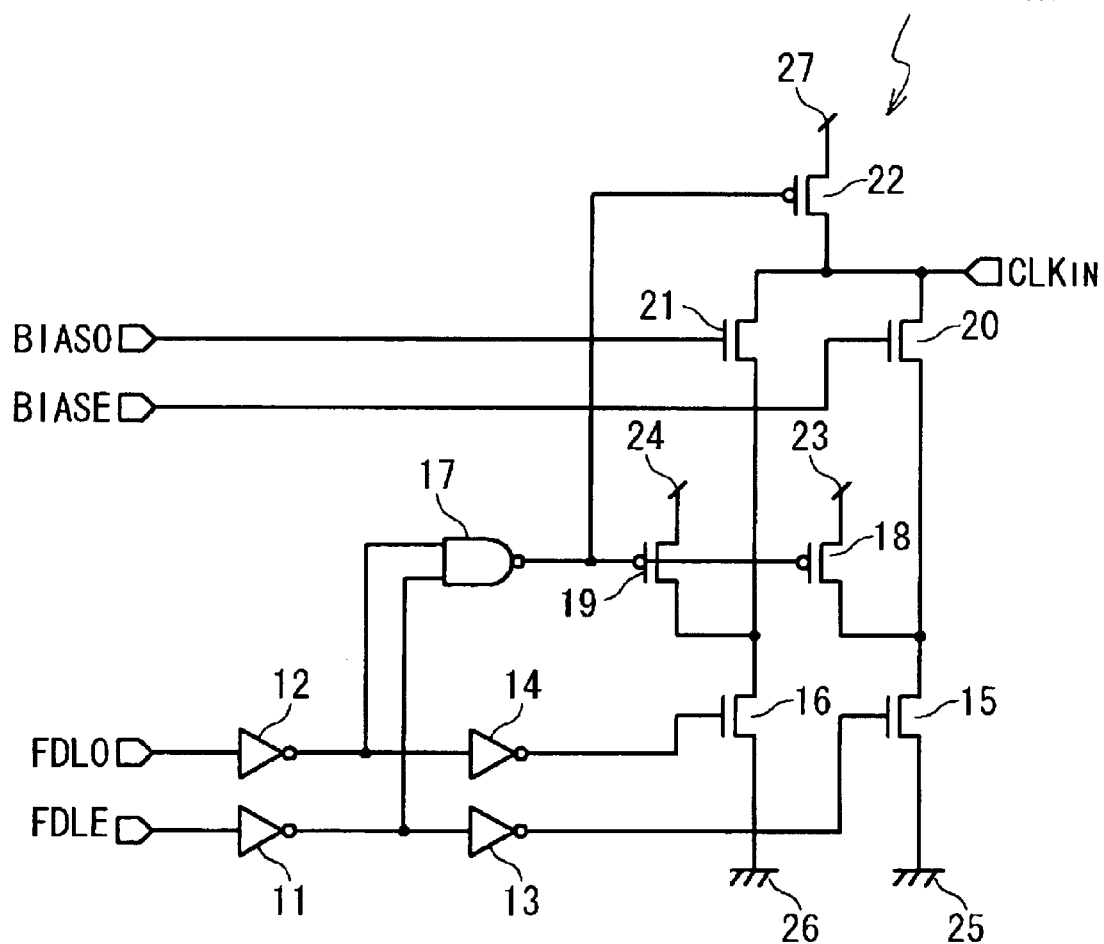
FIG. 2 shows a configuration of a delay synthesis circuit 5.

FIG. 2 shows an example of a circuit diagram of the delay synthesis circuit 5. This figure is identical to the structure described in the reference (Nonpatent Document 1). The delay synthesis circuit 5 includes inverters 11 to 14, N-channel MOSFETs (Metal Oxide Semiconductor Field Effect Transistors) 15 and 16, a NAND gate 17, P-channel MOSFETs 18 and 19, N-channel MOSFETs 20 and 21, and a P-channel MOSFET 22. The clock signals FDLO and FDLE are supplied to the input terminals of the inverters 12 and 11, respectively. The output terminal of the inverter 11 is connected to the gate of the N-channel MOSFET 15 through the inverter 13, while the output terminal of the inverter 12 is connected to the gate of the N-channel MOSFET 16 through the inverter 14. The output terminals of the inverters 11 and 12 are also connected to the input terminals of the NAND gate 17. The output terminal of the NAND gate 17 is connected to the gates of the P-channel MOSFETs 18 and 19. The sources of the P-channel MOSFETs 18 and 19 are connected to power supply terminals 23 and 24 having power supply potentials, respectively. The drains of the P-channel MOSFETs 18 and 19 are connected to the drains of the N-channel MOS transistors 15 and 16, respectively. The sources of the N-channel MOS transistors 15 and 16 are connected to ground terminals 25 and 26 having ground potentials. The drains of the N-channel MOS transistors 15 and 16 are further connected to the sources of the N-channel MOS transistors 20 and 21, respectively. The bias potentials BIASE and BIASO, which were already described, are supplied to the gates of the N-channel MOS transistors 20 and 21, respectively. The drains of the N-channel MOS transistors 20 and 21 are connected to the drain of the P-channel MOS transistor 22. The gate of the P-channel MOS transistor 22 is connected to the output terminal of the NAND gate 17 that was already described. The source of the P-channel MOS transistor 22 is connected to a power supply terminal 27 having the power supply potential. The internal clock $CLK_{IN}$ is output from the output terminal connected to the drains of the N-channel MOS transistors 20 and 21.

Figure 3:
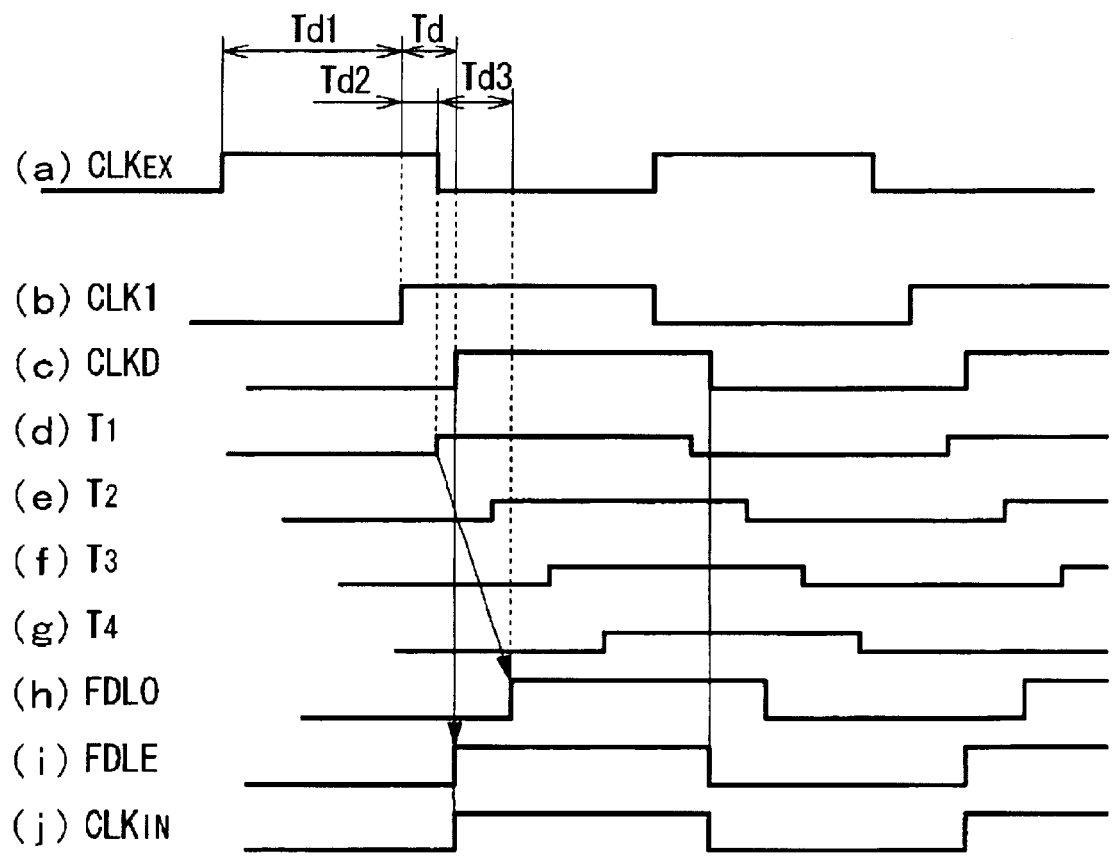
FIG. 3 is a timing chart showing an operation of the DLL circuit in this embodiment.

CLK is inverted to be used through a inverter as not shown. A loading element, for example a resistor, can be connected unparallel with P-channel MOS transistor 22. FIG. 3 shows under this condition.

Referring to FIG. 1, the DLL circuit in this embodiment is set to a state where it has a desired delay time by following operations (or set to the state where it has a desired delay time), so that the internal clock signal $CLK_{IN}$ is generated from the external clock signal $CLK_{EX}$.

The external clock signal $CLK_{EX}$ is input to the input buffer 1 to generate the clock signal CLK1. The clock signal CLK1 is input to the delay selection circuit 2 to be used for generation of the clock signals $T_1$ to $T_N$ inside the delay selection circuit 2. The clock signal CLK1 is also input to the delay circuit 3 to generate the clock signal CLKD.

The controller (not shown) determines a desired value for the delay time of the DLL circuit. When the DLL circuit is applied to a synchronous DRAM that outputs data in synchronization with the external clock signal $CLK_{EX}$, for example, a desired value for the delay time from the external clock signal $CLK_{EX}$ to the internal clock signal $CLK_{IN}$ is determined so that the sum of the delay time from the external clock $CLK_{EX}$ to the internal clock signal $CLK_{IN}$ and the delay time of a circuit that outputs the data in synchronization with the internal clock signal $CLK_{IN}$ matches the period of the external clock signal $CLK_{EX}$.

In response to the desired value for the delay time, the controller generates a control signal indicating which ones of the clock signals $T_1$ to $T_N$ should be output as the clock signals CLK_E and CLK_O, and outputs the control signal to the selector 7 of the delay selection circuit 2. The selector 7 outputs the clock signals CLK_E and CLK_O, in response to the control signal.

Further, the controller determines which ones of the clock signals CLKD, CLK_E, and CLK_O should be output as the clock signals FDLO and FDLE, in response to the desired value for the delay time.

Further, the controller generates the bias voltages BIASE and BIASO indicating the synthesis ratio R for the clock signal FDLE and the clock signal FDLO, in response to the determined desired value for the delay time. The delay synthesis circuit 5 synthesizes the internal clock signal $CLK_{IN}$ from the clock signals FDLO and FDLE, in response to the bias voltages BIASE and BIASO.

When the desired value for the delay time of the DLL circuit is large, the clock signals output from the delay elements close to the delay element $6_N$ in the last stage are selected by the selector 7 as the clock signals CLK_E and CLK_O, and the clock signals CLK_O and CLK_E are selected by the selector 4 as the clock signals FDLO and FDLE, respectively. More specifically, when the clock signals that will be selected are denoted the clock signals $T_m$ and $T_{m+1}$, and the desired value for the delay time is large, the clock signals $T_m$ and $T_{m+1}$, are selected so that m becomes large. This makes the delay times from the external clock signal $CLK_{EX}$ to the clock signals CLK_E and CLK_O longer, thereby increasing the delay time of the DLL circuit. By increasing the number N of the delay elements $6_1$ to $6_N$, the maximum value of the delay time of the DLL circuit can be increased.

On the other hand, when the desired value for the delay time of the DLL circuit is small, the clock signals output from the delay elements close to the delay element $6_1$ in the first stage are selected by the selector 7 as the clock signals CLK_E and CLK_O. This makes the delay times from the external clock signal $CLK_{EX}$ to the clock signals CLK_E and CLK_O shorter, thereby reducing the delay time of the DLL circuit.

In order to make the delay time of the DLL circuit closer to the minimum delay time of the DLL circuit, the clock signals $T_1$ and $T_2$ are selected as the clock signals CLK_O and CLK_E, respectively. Further, the clock signal CLKD supplied from the delay device 3 and the clock signal CLK_O supplied from the delay selection circuit 2 are selected as the clock signals FDLE and FDLO, respectively. This makes the delay times from the external clock signal $CLK_{EX}$ to the clock signals FDLE and FDLO shorter, thereby further reducing the delay time of the DLL circuit.

In order to minimize the delay time of the DLL circuit, the synthesis ratio R of the clock signal FDLE to the clock signal FDLO is set to one, further; that is, the clock signal FDLE is synthesized at a rate of 100%, and the clock signal FDLO is synthesized at a rate of 0% to generate the internal clock signal $CLK_{IN}$.

Since the DLL circuit in this embodiment, which performs the above operations, can generate the internal clock signal $CLK_{IN}$ by using the clock signal CLKD, its minimum delay time is small. FIG. 3 is a timing chart of the DLL circuit showing the operation of minimizing its delay time. When the delay time of the DLL circuit is minimized, the clock signal CLKD is selected as the clock signal FDLE. Further, by setting the synthesis ratio R to one, the internal clock signal $CLK_{IN}$ is purely generated from the clock signal FDLE. Accordingly, the internal clock signal $CLK_{IN}$ has substantially the same waveform as the clock signal CLKD, including its substantially the same rise and fall timings as those of the clock signal CLKD. Moreover, since the clock signal CLKD is generated without the medium of the selector 7 having a large delay time, the delay time from the external clock signal $CLK_{EX}$ to the clock signal CLKD is short. Accordingly, the DLL circuit in this embodiment can generate the internal clock signal $CLK_{IN}$ so that its minimum delay time becomes small.

A minimum delay time Tdmin of the DLL circuit in this embodiment is expressed by the following equation:

$$Tdmin = Td1 + td,$$

in which Td1 indicates the delay time of the input buffer 1, while td indicates the delay time of the delay device 3. Since the delay times of the selector 4 and the delay synthesis circuit 5 are extremely short, they are ignored in this examination. As already mentioned, since the delay time td of the delay device 3 is shorter than the sum of the delay time Td2 of the delay element $6_1$ and the delay time Td3 of the selector 7, the following formula holds:

$$Tdmin < Td1 + Td2 + Td3 \tag{2}$$

Figure 8:
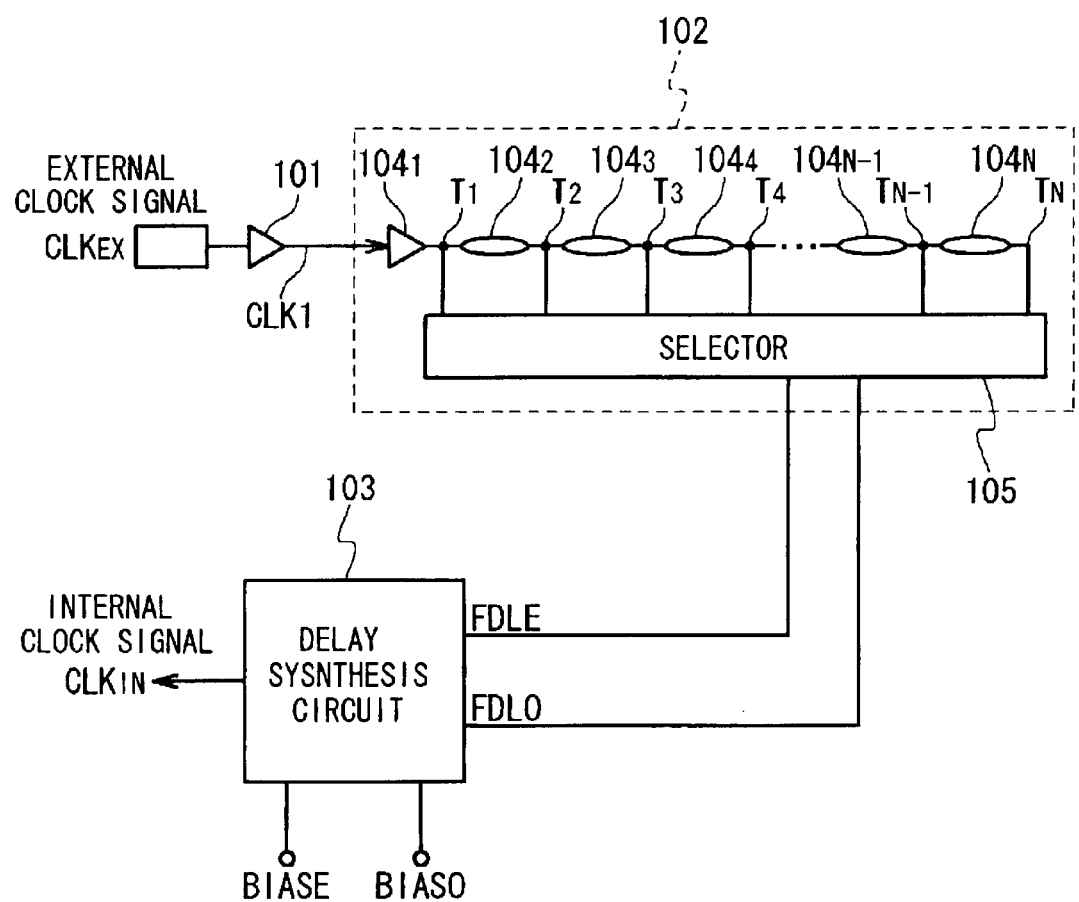
FIG. 8 shows a conventional DLL circuit.
Figure 9:
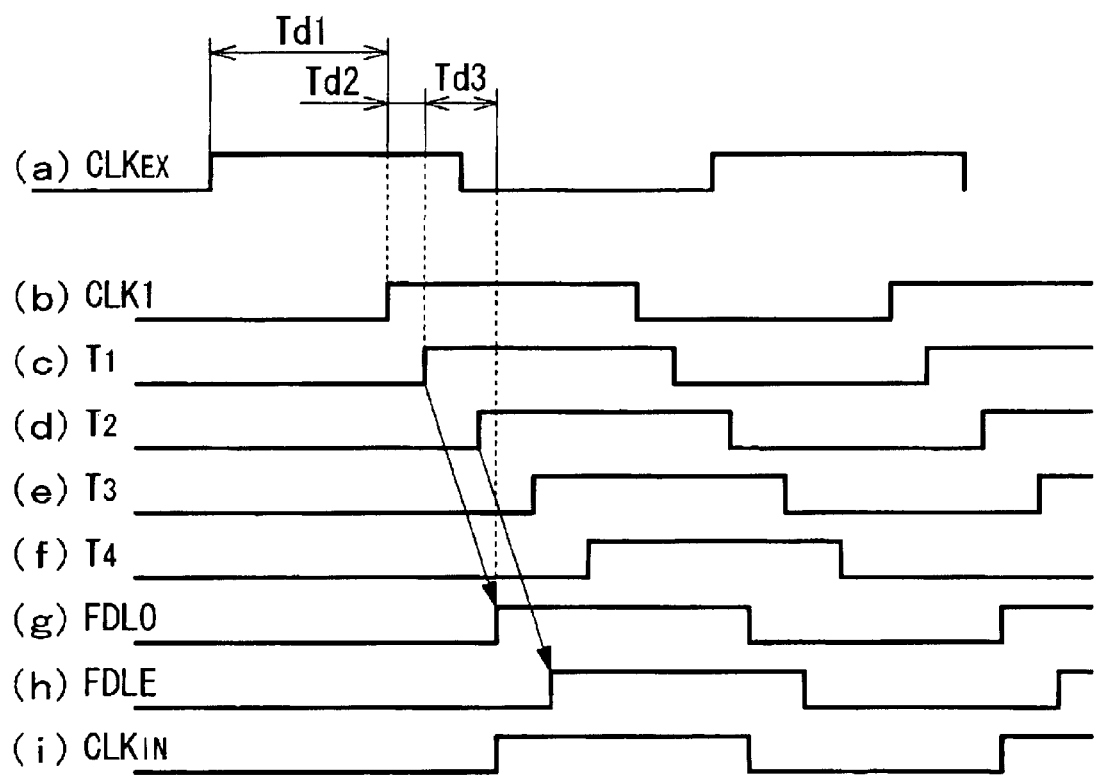
FIG. 9 is a timing chart showing an operation of the conventional DLL circuit.

The following examination corroborates that the DLL circuit in this embodiment can reduce the minimum delay time more than the conventional DLL circuit in FIG. 8. FIG. 9 is a timing chart showing the operation of the conventional DLL circuit to minimize its delay time. In order for the conventional DLL circuit to minimize its delay time, the clock signals T1 and T2 are selected as the clock signals FDLE and FDLO, respectively, and the internal clock signal $CLK_{IN}$ is generated from the clock signals FDLO and FDLE.

A minimum delay time Tdmin' of the conventional DLL circuit is expressed by:

$$Tdmin' = Td1' + Td2' + Td3',$$

in which Td1' indicates the delay time of an input buffer 101, Td2' indicates the delay time of a delay element $104_1$. Td3' indicates the delay time of a selector 105. If elements having same characteristics as the input buffer 1, delay element $6_1$, and selector 7 are used as the input buffer 101, delay element $104_1$, and selector 105, respectively, the minimum delay time Tdmin' of the conventional DLL circuit is the sum of Td1, Td2, and Td3. As seen from Formula (2), the DLL circuit in this embodiment can make the minimum delay time Tdmin smaller than the minimum delay time Tdmin' of the conventional DLL circuit.

As described above, the DLL circuit in this embodiment can reduce its minimum delay time by using the clock signal CLKD to generate the internal clock signal $CLK_{IN}$ while enabling to increase the adjustable range of the delay time by increasing the number N of the delay elements $6_1$ to $6_N$.

In this embodiment, it is ideal that the respective delay times of the delay elements $6_2$ to $6_N$ be all set to Td5, and the delay time td of the delay device 3 be set to satisfy the following equation:

$$td = Td2 + Td3 - Td5 \tag{3}$$

in which Td2 indicates the delay time of the delay element $6_1$, while Td3 indicates the delay time of the selector 7. By setting the delay times of the delay device 3 and the delay elements $6_2$ to $6_N$ as described above, an interval (difference) between the delay times of the two clock signals FDLE and FDLO supplied to the delay synthesis circuit 5 with respect to the external clock signal $CLK_{EX}$ becomes Td5, which is fixed. The fixed interval between the delay times of the clock signals FDLE and FDLO is preferable since it means that the characteristics of the delay synthesis circuit 5 do not need to be adjusted irrespective of which ones of the clock signals will be selected as the clock signals FDLE and FDLO. The fixed interval between the delay times of the clock signals FDLE and FDLO is also preferable in that generation of the bias voltages BIASO and BIASE can be facilitated by the controller.

Figure 4:
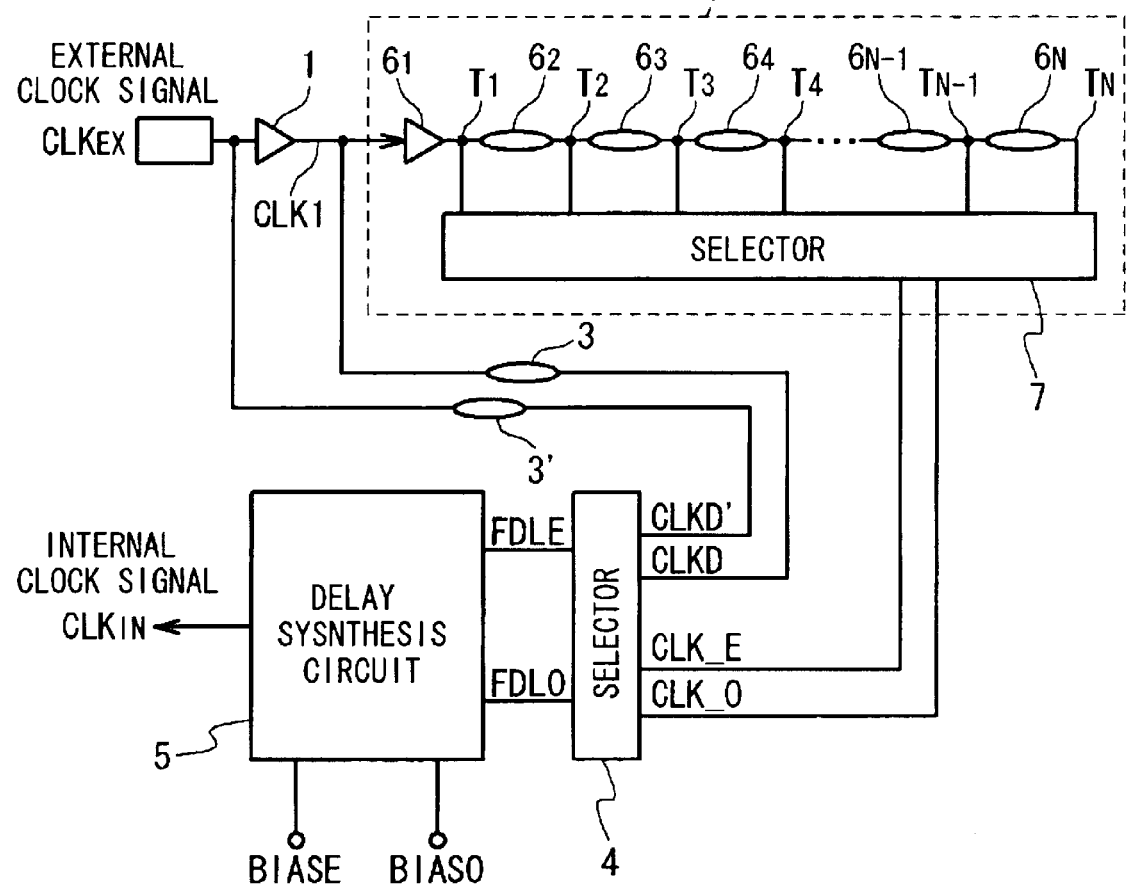
FIG. 4 shows a first variation of the DLL circuit in this embodiment.
Figure 5:
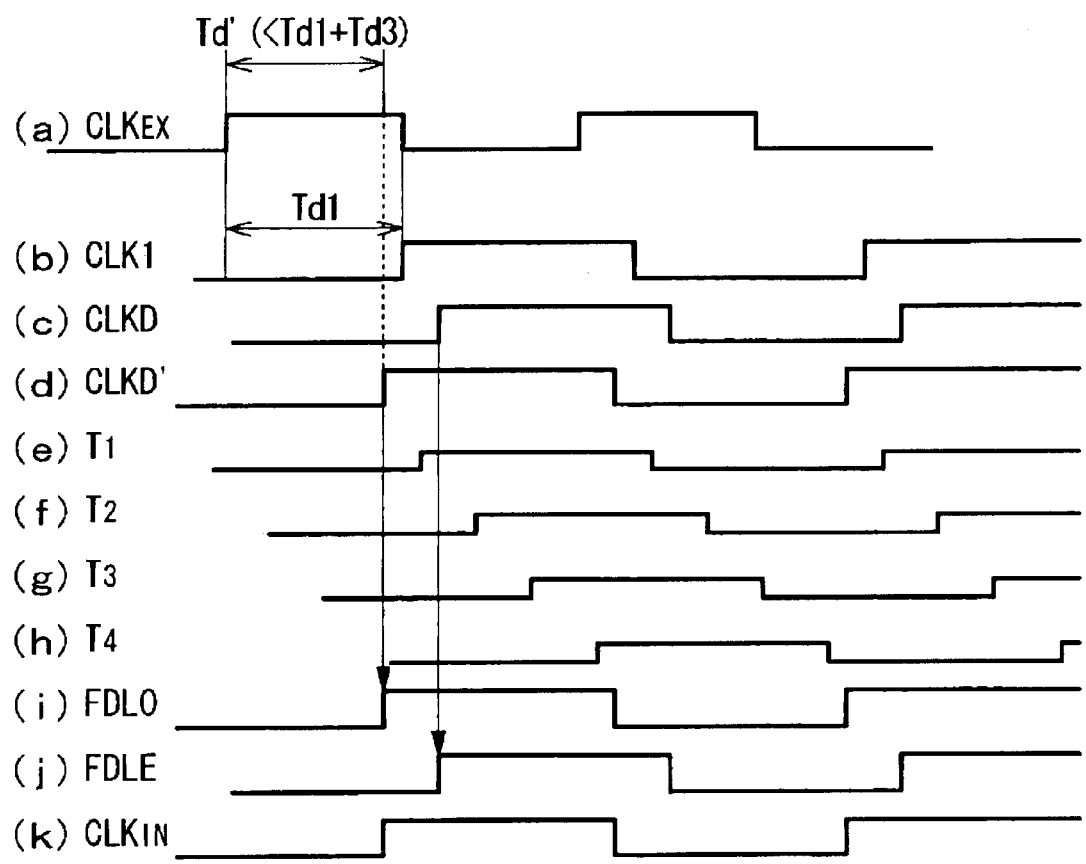
FIG. 5 is a timing chart showing an operation of the first variation of the DLL circuit in this embodiment.

In order to further reduce the minimum delay time of the DLL circuit in this embodiment, addition of a delay device 3', as shown in FIG. 4, is ideal. The delay device 3' receives the external clock signal $CLK_{EX}$ without the medium of the input buffer 1, delays the external clock signal $CLK_{EX}$, and then generates a clock signal CLKD'. A delay time td' of the delay device 3' is set to be shorter than the sum of the delay time Td1 of the input buffer 1 and the delay time td of the delay device 3. The selector 4 outputs two of the clock signals CLKD', CLKD, CLK_E, and CLK_O as the clock signals FDLE and FDLO. In order to minimize the delay time of the DLL circuit in FIG. 4, the clock signals CLKD' and CLKD are selected as the clock signals FDLE and FDLO to generate the internal clock signal $CLK_{IN}$, as shown in FIG. 5. By using the clock signal CLKD' of which the delay time from the external clock signal $CLK_{EX}$ is further shorter for generation of the internal clock signal $CLK_{IN}$, the minimum delay time of the DLL circuit can be further reduced.

When the delay device 3' is added, it is ideal that the respective delay times of the delay elements $6_2$ to $6_N$ be all set to Td5, the delay time td of the delay device 3 be set according to the above Equation (3), and the delay time td' of the delay device 3' be set to satisfy:

$$td'=Td1+Td2+Td3-2\cdot Td5 \qquad (4)$$

Determination of the delay times as described above makes the interval (difference) between the delay times of the two clock signals FDLE and FDLO supplied to, the delay synthesis circuit 5 with respect to the external clock signal $CLK_{EX}$ fixed at Td5, which is preferable for the same reason as in the foregoing description.

Figure 6:
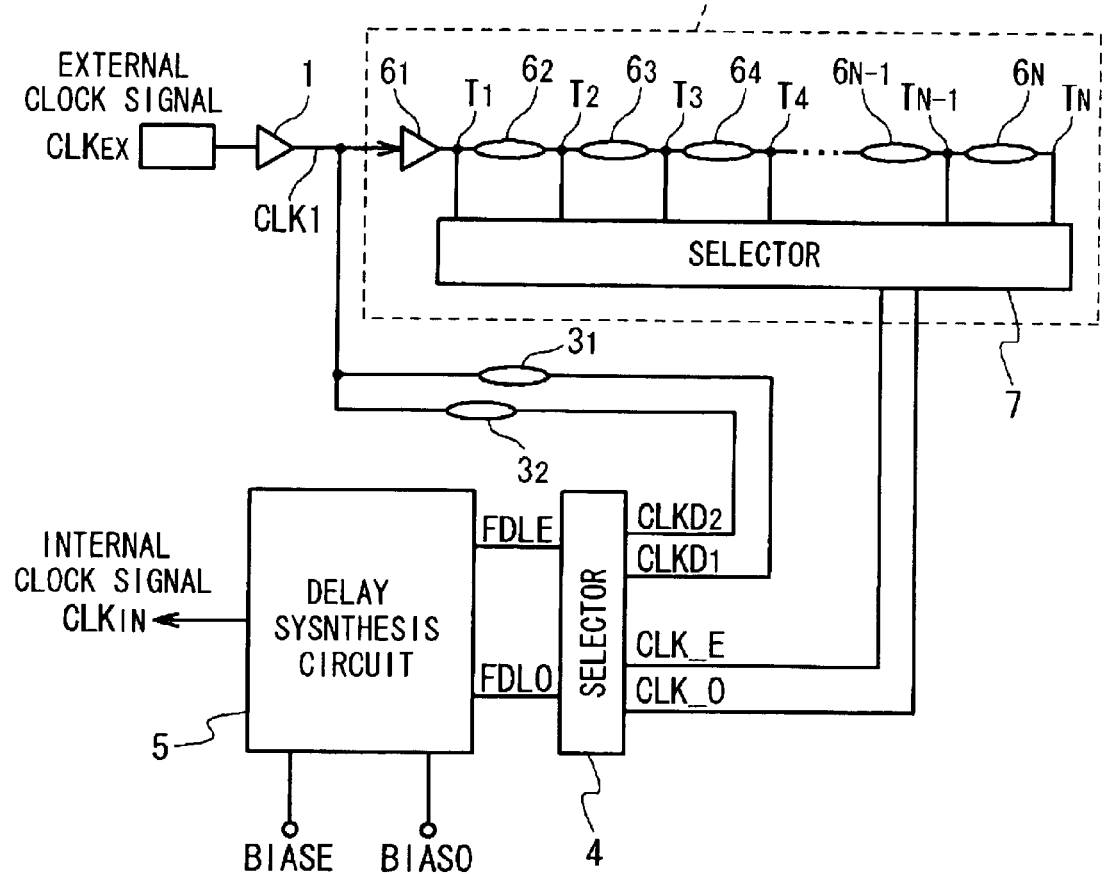
FIG. 6 shows a second variation of the DLL circuit in this embodiment.

Further, in this embodiment, a plurality of clock signals CLKD can be used for generation of the internal clock signal $CLK_{EX}$, as shown in FIG. 6.

A plurality of delay devices 3 is interposed between the output terminal of the input buffer 1 and the selector 4 in order to generate the clock signals CLKD. The delay times of the delay devices 3 with respect to the external clock $CLK_{EX}$ are selected so that the delay times of the clock signals CKLD are all shorter than the sum of the delay time Td2 of the delay element $6_1$ in the first stage of the delay selection circuit 2 and the delay time Td3 of the selector 7 and are also mutually different. In the DLL circuit in FIG. 6, two delay devices 3 are employed for generating two clock signals $CLKD_1$ and $CLKD_2$, respectively. The clock signals CLKD and the delay devices 3 for generating those are differentiated according to subscripts 1 and 2.

When the configuration in FIG. 6 is adopted, the operation of the DLL circuit is modified as follows: the clock signals CLKD generated by the delay devices 3 are input to the selector 4. The selector 4 selects two from among the clock signals CLK_O and CLK_E sent from the delay selection circuit 2 and the clock signals CLKD as the clock signals FDLE and FDLO, and the delay synthesis circuit 5 generates the internal clock signal $CLK_{IN}$ from the clock signals FDLE and FDLO. When the delay time of the DLL circuit is to be reduced, two of the clock signals CLKD are selected as the clock signals FDLE and FELO.

The configuration in FIG. 6 is ideal in that the range of the delay time that the DLL circuit can assume can be extended when the delay time is small.

The number of the clock signals CLK generated and the number of the delay devices 3 are not limited to two. However, when the number of the clock signals CLKD is increased, the delay time of the selector 4 increases, so that the minimum delay time cannot be reduced. For this reason, the configuration in FIG. 6 is effective in a case where the number of the input terminals of the selector 4 is smaller than the number of the input terminals of the selector 7 included in the delay selection circuit 2. It is especially effective in the case where the number of the input terminals of the selector 4 is extremely smaller than the number of the input terminals of the selector 7.

When the configuration in FIG. 6 is adopted, it is ideal that the respective delay times of the delay elements $6_2$ to $6_N$ be all set to Td5, and when M is set to the number of the delay devices 3, a delay time $td_j$ of the delay device $3_j$ be set to satisfy:

$$td_j=Td2+Td3-j\cdot Td5,$$

in which j is a natural number equal to or less than M. Setting the delay times as described above is preferable, because the interval (difference) between the delay times of the two clock signals FDLE and FDLO supplied to the delay synthesis circuit 5 is thereby fixed at Td5.

Figure 7:
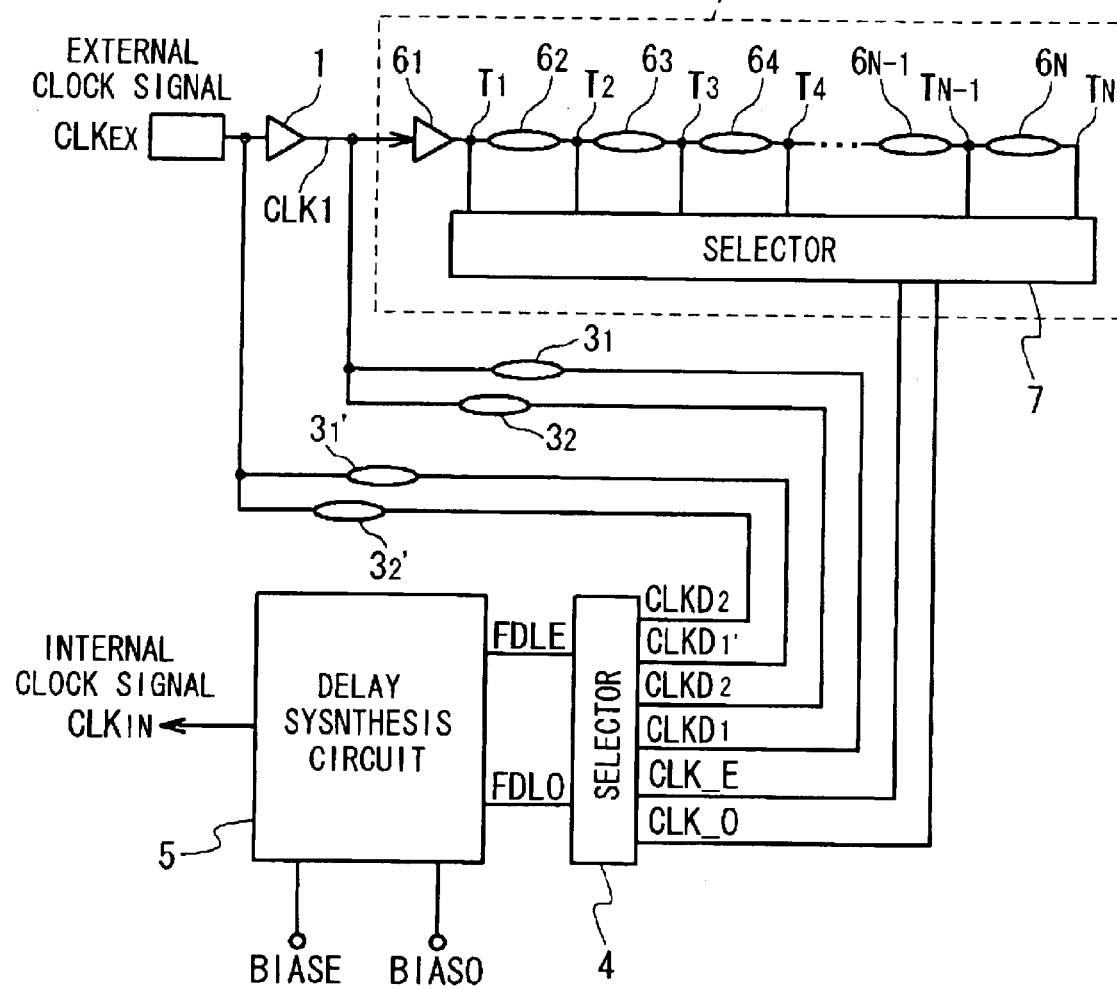
FIG. 7 shows a third variation of the DLL circuit in this embodiment.

Moreover, a plurality of clock signals CLKD' can be generated from the external clock signal $CLK_{EX}$, and the internal clock signal $CLK_{IN}$ can be generated from the clock signals CLKD', as shown in FIG. 7. The clock signals CLKD' in FIG. 7 are differentiated according to the superscripts 1 and 2. More specifically, in the configuration in FIG. 7, the internal clock signal $CLK_{IN}$ is generated using clock signals $CLKD_1'$ and $CLKD_2'$ generated by delay devices $3_1'0$ and $3_2'$, respectively.

At this point, it is possible that a plurality of the clock signals CLKD are generated from the clock signal CLK1 and the plurality of the clock signals CLKD are used for generation of the internal clock signal $CLK_{IN}$. FIG. 7 shows the configuration where a plurality of the clock signals, which are $CLKD_1$ and $CLKD_2$, are used for generation of the internal clock signal $CLK_{IN}$.

The delay times of the delay devices 3 and 3' are selected so that the delay times of the clock signals CLKD and CLKD' with respect to the external clock signal $CLK_{EX}$ are shorter than the sum of the delay time Td1 of the input buffer 1, delay time Td2 of the delay element $6_1$ in the first stage of the delay selection circuit 2, and the delay time Td3 of the selector 7 and are mutually different.

The operation of the DLL circuit in FIG. 7 is modified as follows: the clock signals CLKD and CLKD' generated by the delay devices 3 and 3', respectively, are input to the selector 4. The selector 4 selects two of the clock signals CLK_O and CLK_E sent from the delay selection circuit 2 and the clock signals CLKD and CLKD' as the clock signals FDLE and FDLO, and the delay synthesis circuit 5 generates the internal clock signal $CLK_{IN}$ from the clock signals FDLE and FDLO. When the delay time of the DLL circuit is reduced, two of the clock signals CLKD and CLKD' are selected as the clock signals FDLE and FDLO.

The configuration in FIG. 7 is ideal in that the minimum delay time can be further reduced and at the same time the range of the delay time that the DLL circuit can assume can be extended when the delay time is small.

When the configuration in FIG. 7 is adopted, it is ideal that the delay time of the delay device 3' having the shortest delay time among the delay devices 3' be shorter than the sum of the delay time Td1 of the input buffer 1 and the delay time of the delay device 3 having the shortest delay time among the delay devices 3. This makes it possible to further reduce the minimum delay time of the DLL circuit.

Further, it is ideal that the delay time of an arbitrary delay device 3' be shorter than the sum of the delay time Td1 of the input buffer 1 and the delay time of the delay device 3 having the shortest delay time among the delay devices 3. This makes it possible to further reduce the minimum delay time and at the same time to further extend the range of the delay time that the DLL circuit can assume when the delay time is small.

In this case, it is ideal that the respective delay times of the delay elements $6_2$ to $6_N$ be all set to Td5 and respective delay times $td_j$ and $td_k'$ of the delay devices $3_j$ and $3_k'$ be set to satisfy:

$$td_j=Td2+Td3-j\cdot Td5 \qquad (5)$$

$$td_k'=Td1+Td2+Td3-(M+k)\cdot Td5 \qquad (6)$$

in which j is a natural number equal to or less than the number M of the delay devices 3, and k is a natural number equal to or less than the number M' of the delay devices 3'. In the configuration in FIG. 7, for example, the delay time $td_1$ of the delay device $3_1$ and the delay time $td_2$ of the delay device $3_2$ are set to satisfy:

$$td_1 = Td2 + Td3 - Td5$$

$$td_2 = Td2 + Td3 - 2 \cdot Td5.$$

Then, the delay time td1' of the delay device $3_1'$ and the delay time td2' of the delay device $3_2'$ are set to satisfy:

$$td_1' = Td1 + Td2 + Td3 - 3 \cdot Td5$$

$$td_2' = Td1 + Td2 + Td3 - 4 \cdot Td5.$$

Setting the delay times as described above is preferable, because the interval (difference) between the delay times of the two clock signals FDLE and FDLO supplied to the delay synthesis circuit 5 with respect to the external clock signal $CLK_{EX}$ is thereby fixed at Td5.

In the configuration in FIG. 7, the number of the generated clock signals CLKD and CLKD' and the number of the delay devices 3 and 3' are not limited to two. However, if the total number of the clock signals CLKD and CLKD' is increased, the delay time of the selector 4 increases, so that the minimum delay time cannot be reduced. For this reason, the configuration in FIG. 7 is effective in the case where the number of the input terminals of the selector 4 is smaller than the number of the input terminals of the selector 7 included in the delay selection circuit 2. It is especially effective in the case where the number of the input terminals of the selector 4 is extremely smaller than the number of the input terminals of the selector 7.

The meritorious effects of the present invention are summarized as follows.

The present invention provides a DLL circuit with a small minimum delay time.

The present invention also provides a DLL circuit with a small minimum delay time while allowing a wide range of adjustment of the delay time.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A Delay Locked Loop DLL circuit comprising:
   a first delay circuit for delaying an input clock signal to output a plurality of delayed clock signals;
   a first selector for selecting a first delayed clock signal and a second delayed clock signal from among the plurality of delayed clock signals, for output;
   a second delay circuit for delaying the input clock signal to generate a slightly delayed clock signal;
   a second selector for selecting two selected clock signals from among the slightly delayed clock signal, the first delayed clock signal, and the second delayed clock signal, for output; and
   a delay synthesis circuit for generating an internal clock signal from said selected clock signals, for output.

2. The DLL circuit according to claim 1, wherein a delay time during which the slightly delayed clock signal is generated from the input clock signal is shorter than a sum of a delay time of said first delay element and a delay time of said first selector.

3. The DLL circuit according to claim 1, wherein the slightly delayed clock signal includes M slightly delayed signals, where M is an integer of at least one, and M+2 is smaller than a number N of said plurality of delayed clock signals.

4. The DLL circuit according to claim 1, wherein said first delay circuit includes first to Nth delay elements;
   said input clock signal is supplied to an input terminal of said first delay element;
   an output terminal of the ith delay element, where i is an arbitrary natural number not more than N−1, is connected to an input terminal of an (i+1)th delay element; and
   said first selector selects the clock signals output from output terminals of the mth delay element and an (m+1)th delay element, respectively, as a first delayed clock signal and a second delayed clock signal, for output, where m is a number selected from among natural numbers of at least one and not more than N−1.

5. The DLL circuit according to claim 4, wherein a delay time during which the slightly delayed clock signal is generated from the input clock signal is smaller than a sum of a delay time of said first delay element and a delay time of said first selector.

6. The DLL circuit according to claim 2, wherein
   the slightly delayed clock signal includes M slightly delayed clock signals, where M is an integer of at least one;
   said second delay circuit includes first to Mth delay devices for respectively generating the slightly delayed clock signals from the input clock signal;
   delay times of the second to said Nth delay elements are identical; and
   a delay time $td_j$ of the jth delay device among said first to said Mth delay devices, where j is an arbitrary natural number not more than M, is expressed, using a delay time Td2 of said first delay element, a Td3 of said first selector, and delay times Td5 of said second to said Nth delay elements:

$$td_j = Td2 + Td3 - j \cdot Td5.$$

7. A DLL circuit comprising:
   an input buffer for receiving an external clock signal and then generating an input clock signal;
   a first delay circuit for delaying the input clock signal to output a plurality of delayed clock signals;
   a first selector for selecting a first delayed clock signal and a second delayed clock signal from among the plurality of delayed clock signals, for output;
   a second delay circuit for delaying said input clock signal to generate a first slightly delayed clock signal;
   a third delay circuit for delaying an external clock signal to generate a second slightly delayed clock signal;
   a second selector for selecting two selected clock signals from among the first slightly delayed clock signal, the second slightly delayed clock signal, the first delayed clock signal, and the second delayed clock signal, for output; and
   a delay synthesis circuit for synthesizing an internal clock signal from the selected clock signals, for output.

8. The DLL circuit according to claim 7, wherein a delay time during which the first slightly delayed clock signal is generated from the input clock signal is shorter than a sum of a delay time of said first delay element and a delay time of said first selector; and a delay time during which the second slightly delayed clock signal is generated from the external clock signal is smaller than a sum of a delay time of said input buffer and a delay time during which the first slightly delayed clock signal is generated from the input clock signal.

9. The DLL circuit according to claim 7, wherein said first delay circuit includes first to Nth delay elements;

the input clock signal is supplied to an input terminal of said first delay element;

an output terminal of the ith delay element, where i is an arbitrary natural number no more than N−1, is connected to an input terminal of the (i+1)th delay element; and said first selector selects the clock signals output from an output terminal of the mth delay element, where m is a number selected from among natural numbers of at least one and not more than N−1, and an output terminal of an (m+1)th delay element among said first to said Nth delay elements as the first delayed clock signal and the second delayed clock signal, for output.

10. The DLL circuit according to claim 9, wherein delay times of the second to said Nth delay elements are identical;

the first slightly delayed clock signal includes M first slightly delayed clock signals, where M is an integer of at least one;

the second slightly delayed clock signal includes M' second slightly delayed clock signals, where M' is an integer of at least one;

said second delay circuit includes first to Mth delay devices for respectively generating the first slightly delayed clock signals;

said third delay circuit includes first to M'th slightly delay devices for respectively generating the second slightly delayed clock signals; and a delay time $td_j$ of the jth delay device among said first to said Mth delay devices, where j is a natural number of not more than M, and a delay time $td_k$ of the kth slight delay device among said first to said M'th slight delay devices, where k is a natural number of not more than M' are expressed by following formulas, using a delay time Td1 of said input buffer, a delay time Td2 of said first delay element, a delay time Td3 of said first selector, and delay times Td5 of said second to said Nth delay elements:

$$td_j = Td2 + Td3 - j \cdot Td5,$$

$$td_k' = Td1 + Td2 + Td3 - (M+k) \cdot Td5.$$

11. The DLL circuit according to claim 1, wherein said delay synthesis circuit generates the internal clock signal from the selected clock signals, for output, so that a rise timing of the internal clock signal is between rise timings of the selected clock signals, and a fall timing of the internal clock signal is between fall timings of the selected clock signals.

12. The DLL circuit according to claim 7, wherein said delay synthesis circuit generates the internal clock signal from the selected clock signals, for output, so that a rise timing of the internal clock signal is between rise timings of the selected clock signals, and a fall timing of the internal clock signal is between fall timings of the selected clock signals.

* * * * *